US012642024B2

(12) United States Patent
Hayashi et al.

(10) Patent No.: US 12,642,024 B2
(45) Date of Patent: May 26, 2026

(54) PLASMA PROCESSING METHOD

(71) Applicant: HITACHI HIGH-TECH CORPORATION, Tokyo (JP)

(72) Inventors: Tatsuya Hayashi, Tokyo (JP); Tomoyoshi Ichimaru, Tokyo (JP); Mineaki Kodama, Tokyo (JP); Masashi Kawabata, Tokyo (JP); Yujiro Yoneda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/909,524

(22) PCT Filed: Jul. 14, 2021

(86) PCT No.: PCT/JP2021/026417
§ 371 (c)(1),
(2) Date: Sep. 6, 2022

(87) PCT Pub. No.: WO2023/286192
PCT Pub. Date: Jan. 19, 2023

(65) Prior Publication Data
US 2024/0203751 A1     Jun. 20, 2024

(51) Int. Cl.
H10P 50/26          (2026.01)
H01J 37/32          (2006.01)

(52) U.S. Cl.
CPC ...... H10P 50/267 (2026.01); H01J 37/32146 (2013.01); H01J 2237/334 (2013.01)

(58) Field of Classification Search
None
See application file for complete search history.

(56) References Cited

U.S. PATENT DOCUMENTS

| | | |
|---|---|---|
| 2,981,287 A | 4/1961 | Caslow |
| 3,452,781 A | 7/1969 | Napolitano |
| | (Continued) | |

FOREIGN PATENT DOCUMENTS

| | | |
|---|---|---|
| JP | S62-14429 A | 1/1987 |
| JP | H02-230729 A | 9/1990 |
| | (Continued) | |

OTHER PUBLICATIONS

Search Report mailed Aug. 24, 2021 in International Application No. PCT/JP2021/026417.

(Continued)

*Primary Examiner* — Stephanie P Duclair
(74) *Attorney, Agent, or Firm* — Miles & Stockbridge, P.C.

(57)          ABSTRACT

Provided is a plasma processing method capable of achieving flat etching process while suppressing vertical etching. The plasma processing method for plasma-etching a titanium nitride (TiN) film that forms a metal gate and contacts an insulating film on both sides includes the step of etching the titanium nitride (TiN) film by using plasmas that are generated by using a mixed gas of boron trichloride ($BCl_3$) gas, nitrogen ($N_2$) gas, and nitrogen trifluoride ($NF_3$) gas and are generated by radio-frequency power modulated by a pulse, wherein the pulse has a first period with a first amplitude as its amplitude and a second period with a second amplitude as its amplitude and wherein the second amplitude is greater than 0 and less than the first amplitude.

4 Claims, 9 Drawing Sheets

(56) References Cited

U.S. PATENT DOCUMENTS

| | | | |
|---|---|---|---|
| 3,760,843 A | 9/1973 | Larner | |
| 4,450,031 A | 5/1984 | Ono et al. | |
| 4,638,837 A | 1/1987 | Buike et al. | |
| 4,669,404 A | 6/1987 | Yoneda | |
| 4,844,767 A | 7/1989 | Okudaira et al. | |
| 4,960,073 A | 10/1990 | Suzuki et al. | |
| 5,178,962 A | 1/1993 | Miyamoto et al. | |
| 5,284,544 A | 2/1994 | Mizutani et al. | |
| 5,992,460 A | 11/1999 | Akimoto | |
| 5,998,986 A | 12/1999 | Ido | |
| 6,082,406 A | 7/2000 | Williamson, Jr. et al. | |
| 6,145,541 A | 11/2000 | Hirota | |
| 6,156,152 A | 12/2000 | Ogino et al. | |
| 6,162,323 A | 12/2000 | Koshimizu | |
| 6,192,937 B1 | 2/2001 | Fagerlie et al. | |
| 6,194,313 B1* | 2/2001 | Singh | H01L 21/76895 |
| | | | 438/692 |
| 6,287,980 B1 | 9/2001 | Hanazaki et al. | |
| 6,551,447 B1 | 4/2003 | Savas et al. | |
| 6,867,086 B1 | 3/2005 | Chen et al. | |
| 9,040,422 B2 | 5/2015 | Wang et al. | |
| 9,607,856 B2 | 3/2017 | Wang et al. | |
| 10,121,686 B2 | 11/2018 | Ogawa et al. | |
| 2002/0106845 A1 | 8/2002 | Chao et al. | |
| 2003/0212507 A1 | 11/2003 | Wei et al. | |
| 2004/0129671 A1 | 7/2004 | Ji et al. | |
| 2004/0178180 A1 | 9/2004 | Kaji et al. | |
| 2006/0016783 A1 | 1/2006 | Wu et al. | |
| 2006/0288934 A1 | 12/2006 | Takahashi et al. | |
| 2007/0163477 A1 | 7/2007 | Nagata et al. | |
| 2007/0199922 A1 | 8/2007 | Shen et al. | |
| 2007/0286967 A1 | 12/2007 | Ide et al. | |
| 2008/0110400 A1 | 5/2008 | Satou et al. | |
| 2008/0233730 A1 | 9/2008 | Yu et al. | |
| 2009/0029564 A1 | 1/2009 | Yamashita et al. | |
| 2011/0120649 A1 | 5/2011 | Satou et al. | |
| 2011/0230038 A1 | 9/2011 | Hayashi et al. | |
| 2012/0064726 A1 | 3/2012 | Yang et al. | |
| 2012/0222751 A1 | 9/2012 | Okabe | |
| 2012/0231553 A1 | 9/2012 | Okita et al. | |
| 2012/0255617 A1 | 10/2012 | Miyazoe et al. | |
| 2013/0270625 A1 | 10/2013 | Jang et al. | |
| 2013/0319615 A1 | 12/2013 | Cho et al. | |
| 2014/0020831 A1 | 1/2014 | Ohgoshi et al. | |
| 2014/0057447 A1 | 2/2014 | Nozawa et al. | |
| 2014/0091435 A1 | 4/2014 | Chan et al. | |
| 2014/0134842 A1 | 5/2014 | Zhang et al. | |
| 2014/0256131 A1 | 9/2014 | Wang et al. | |
| 2014/0262034 A1 | 9/2014 | Ishibashi et al. | |
| 2014/0264483 A1 | 9/2014 | Yoshida et al. | |
| 2015/0011093 A1 | 1/2015 | Singh et al. | |
| 2015/0083582 A1 | 3/2015 | Dhindsa et al. | |
| 2015/0330519 A1 | 11/2015 | Maurer et al. | |
| 2015/0357205 A1 | 12/2015 | Wang et al. | |
| 2016/0133530 A1 | 5/2016 | Sonoda et al. | |
| 2016/0177443 A1 | 6/2016 | Kumar et al. | |
| 2016/0379857 A1 | 12/2016 | Ogawa et al. | |
| 2017/0101713 A1 | 4/2017 | Wang et al. | |
| 2017/0221682 A1 | 8/2017 | Nishimura et al. | |
| 2017/0229314 A1 | 8/2017 | Tan et al. | |
| 2018/0047595 A1 | 2/2018 | Kofuji et al. | |
| 2018/0061663 A1* | 3/2018 | Chandrashekar | |
| | | | H01L 21/32136 |
| 2018/0144948 A1 | 5/2018 | Maruyama et al. | |
| 2018/0277652 A1* | 9/2018 | Park | H01L 21/76897 |
| 2021/0082750 A1* | 3/2021 | Yu | H01L 23/535 |
| 2021/0335625 A1 | 10/2021 | Kofuji et al. | |
| 2023/0282491 A1 | 9/2023 | Kofuji et al. | |

FOREIGN PATENT DOCUMENTS

| | | | |
|---|---|---|---|
| JP | H03-012924 A | 1/1991 | |
| JP | H03-218018 A | 9/1991 | |
| JP | H04-087332 A | 3/1992 | |
| JP | H04-180621 A | 6/1992 | |
| JP | H04-225226 A | 8/1992 | |
| JP | H04-298033 A | 10/1992 | |
| JP | H05-07763 A | 1/1993 | |
| JP | H05-234947 A | 9/1993 | |
| JP | H06-053173 A | 2/1994 | |
| JP | H06-077184 A | 3/1994 | |
| JP | H08-107101 A | 4/1996 | |
| JP | H09-185999 A | 7/1997 | |
| JP | H10-335314 A | 12/1998 | |
| JP | 2000-150196 A | 5/2000 | |
| JP | 2000-306884 A | 11/2000 | |
| JP | 2001-85342 A | 3/2001 | |
| JP | 2001-160549 A | 6/2001 | |
| JP | 2001-319882 A | 11/2001 | |
| JP | 2003-229419 A | 8/2003 | |
| JP | 2004-349717 A | 12/2004 | |
| JP | 2006-086449 A | 3/2006 | |
| JP | 2007-005491 A | 1/2007 | |
| JP | 2007-235136 A | 9/2007 | |
| JP | 2007-287902 A | 11/2007 | |
| JP | 2008-124190 A | 5/2008 | |
| JP | 2010-045171 A | 2/2010 | |
| JP | 2011-198983 A | 10/2011 | |
| JP | 2013-214583 A | 10/2013 | |
| JP | 2013-251546 A | 12/2013 | |
| JP | 2014-075578 A | 4/2014 | |
| JP | 2014-229751 A | 12/2014 | |
| JP | 2015-50362 A | 3/2015 | |
| JP | 2015-065434 A | 4/2015 | |
| JP | 2015-095493 A | 5/2015 | |
| JP | 2015-188025 A | 10/2015 | |
| JP | 2016-051846 A | 4/2016 | |
| JP | 2016-145412 A | 8/2016 | |
| JP | 2016-207771 A | 12/2016 | |
| JP | 2017-183688 A | 10/2017 | |
| JP | 2018-093226 A | 6/2018 | |
| JP | 2018-533207 A | 11/2018 | |
| KR | 10-2005-0099723 A | 10/2005 | |
| KR | 10-2008-0086172 A | 9/2008 | |
| KR | 10-2008-0086686 A | 9/2008 | |
| KR | 10-2017-0101952 A | 9/2017 | |
| KR | 10-2017-0108916 A | 9/2017 | |
| TW | 544805 B | 8/2003 | |
| TW | 200605226 A | 2/2006 | |
| TW | 201234474 A | 8/2012 | |
| TW | 201417172 A | 5/2014 | |
| TW | 201428848 A | 7/2014 | |
| TW | 201448041 A | 12/2014 | |
| TW | 201517162 A | 5/2015 | |
| TW | 201614711 A | 4/2016 | |
| WO | 2005104203 A | 11/2005 | |
| WO | 2016121075 A1 | 8/2016 | |
| WO | 2020161879 A1 | 8/2020 | |

OTHER PUBLICATIONS

Written Opinion mailed Aug. 24, 2021 in International Application No. PCT/JP2021/026417.

Office Action mailed Mar. 1, 2023 in Taiwanese Application No. 111126228.

Office Action mailed Jan. 26, 2024 in Korean Application No. 10-2022-7029788.

Notice of Allowance mailed Feb. 16, 2022 in U.S. Appl. No. 16/216,455.

Office Action mailed Apr. 2, 2021 in U.S. Appl. No. 15/558,005.

Office Action mailed Apr. 29, 2021 in U.S. Appl. No. 16/216,455.

Office Action mailed Aug. 24, 2020 in U.S. Appl. No. 15/558,005.

Office Action mailed Dec. 9, 2019 in Korean Application No. 10-2018-0157894.

Office Action mailed Feb. 23, 2018 in Taiwanese Application No. 106123071.

Office Action mailed Feb. 28, 2023 in Japanese Application No. 2022-552363.

Office Action mailed Feb. 7, 2020 in U.S. Appl. No. 15/558,005.

Office Action mailed Jul. 21, 2020 in Japanese Application No. 2019-124995.

(56)          References Cited

OTHER PUBLICATIONS

Office Action mailed Jun. 14, 2019 in U.S. Appl. No. 15/558,005.
Office Action mailed Mar. 5, 2019 in Japanese Application No. 2018-037128.
Office Action mailed May 12, 2022 in U.S. Appl. No. 15/558,005.
Office Action mailed May 6, 2022 in Taiwanese Application No. 111104241.
Office Action mailed Nov. 26, 2018 in U.S. Appl. No. 15/558,005.
Office Action mailed Nov. 30, 2022 in U.S. Appl. No. 15/558,005.
Office Action mailed Oct. 15, 2021 in U.S. Appl. No. 15/558,005.
Office Action mailed Sep. 28, 2018 in Taiwanese Application No. 106123071.
Search Report mailed Apr. 6, 2021 in International Application No. PCT/JP2021/004592.
Search Report mailed Jul. 5, 2016 in International Application No. PCT/JP2016/063129.
Search Report mailed Mar. 10, 2020 in International Application No. PCT/JP2019/050413.
Search Report mailed Mar. 12, 2019 in International Application No. PCT/JP2019/004577.
Search Report mailed Sep. 7, 2021 in International Application No. PCT/JP2021/024374.
Written Opinion mailed Apr. 6, 2021 in International Application No. PCT/JP2021/004592.
Written Opinion mailed Sep. 7, 2021 in International Application No. PCT/JP2021/024374.

* cited by examiner 201    202

| Etch Time | Gas flow rate | | | Pres. | Microwave | | | |
|---|---|---|---|---|---|---|---|---|
| | Ar | BCl$_3$ | N$_2$ | NF$_3$ | | Power 1 | Power 2 | Frequency | Duty Ratio |
| s | ml/min | | | | mTorr | W | W | Hz | % |
| 50 | 75 | 40 | 50 | 13 | 3.0 | 1100 | 300 | 100 | 50 |

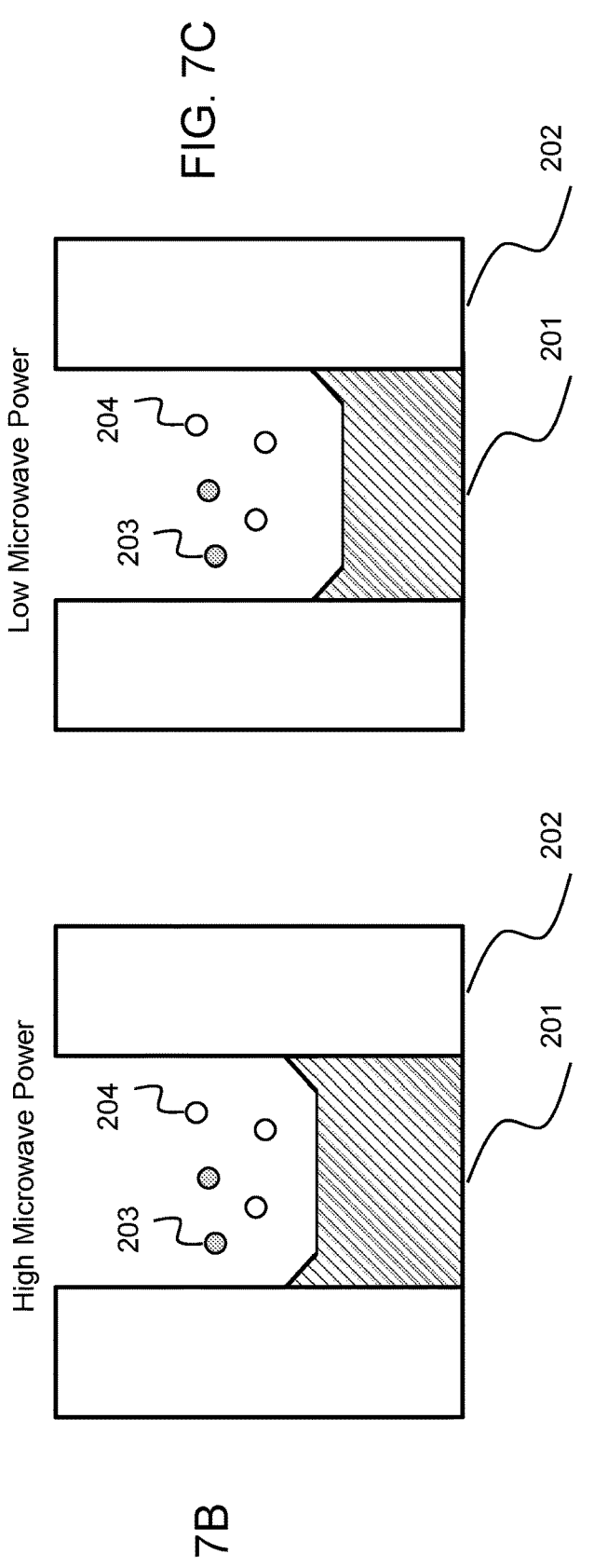
FIG. 7C
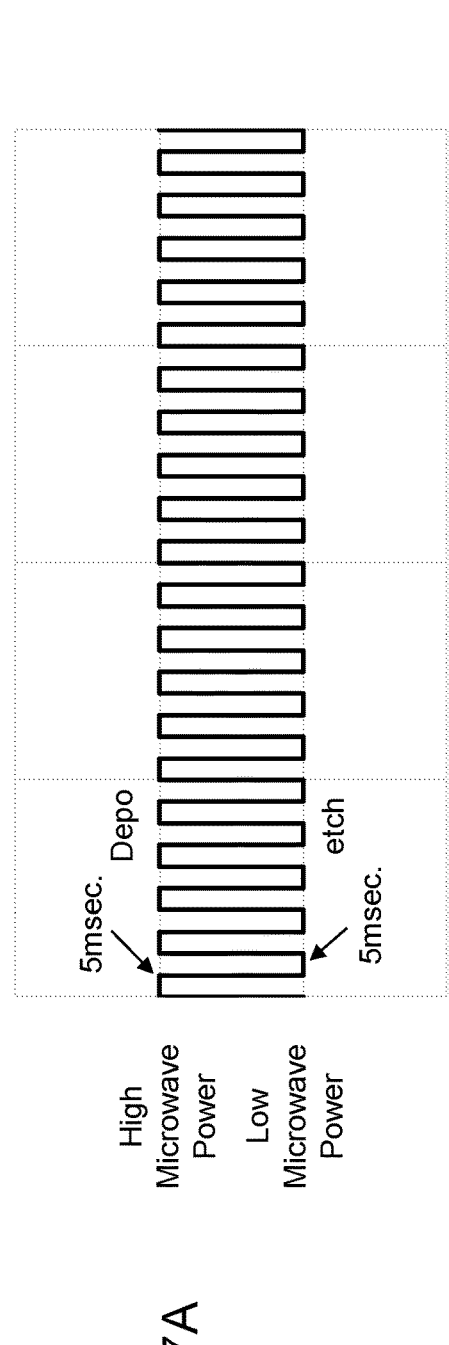
FIG. 7A
FIG. 7B

FIG. 9

PLASMA PROCESSING METHOD

TECHNICAL FIELD

The present invention relates to a plasma processing method.

BACKGROUND ART

In recent years, along with the miniaturization of metal-oxide-semiconductor field-effect-transistor (MOS FET) devices, which are used in semiconductor devices such as, for example, electronic devices, the thickness of the gate oxide film is generally required to be less than or equal to 2 nm. Therefore, the perpendicularity of the etching shape is strictly required, and it is necessary to increase the controllability of the etching process.

Especially, in the gate-last type high-k/metal gate formation, etching the metal film (TiN) without footing, in other words, with a flat bottom surface is a necessary technique to fabricate high-quality semiconductor devices.

As a technique for perpendicularly processing a TiN film, Patent Document 1 discloses a method of suppressing vertical etching and performing lateral etching without applying a bias, using a plasma mixture of carbon tetrafluoride ($CF_4$) and oxygen ($O_2$).

Additionally, Patent Document 2 discloses a method of increasing the etching process accuracy by pulse modulation of plasma generation power and a radio-frequency bias.

CITATION LIST

Patent Documents

Patent Document 1: Japanese Patent Application Laid-Open No. 2007-287902
Patent Document 2: Japanese Patent Application Laid-Open No. 2015-95493

SUMMARY OF THE INVENTION

Problem to be Solved by the Invention

An electron shading phenomenon is one of the causes of a taper shape called "footing" on the bottom surface near the sidewalls after etching processing. The electron shading phenomenon occurs during etching processing using plasmas, due to the electrons that move isotropically because the electrons are not affected by the attraction by a radio-frequency bias and are charged to an oxide film such as a gate sidewall, while ions in the plasmas are attracted by a radio-frequency bias and therefore enter the wafer perpendicularly thereto. This phenomenon causes the ions to concentrate on the sidewalls, and therefore the footing remains as the etching progresses.

Particularly, the recent miniaturization of semiconductor devices has led to narrower gate widths, which makes it more difficult for ions to penetrate, and thus footing is more likely to occur.

In order to solve this problem, according to the conventional technique described in Patent Document 1, mixture gas plasma of oxygen ($O_2$) and carbon tetrafluoride ($CF_4$) is used to achieve a high processing pressure and a high wafer control temperature without applying bias radio-frequency power, thereby enabling lateral etching so as to improve the footing.

From the viewpoint of ensuring strict controllability for etching process that responds to further miniaturization of semiconductor elements, the technique in Patent Document 1 is insufficient for the following reasons. Specifically, in the conventional technique, dry etching is performed by using gas plasma, and therefore an ion bombardment effect by the ions in the plasmas prevents the vertical etching amount from being reduced to 0, thus making it difficult for the processed bottom surface to be flat and also leaving footing problematically.

Furthermore, in order to suppress the vertical etching, Patent Document 2 has proposed a technique for controlling deposition and etching by pulse modulation of plasma generation power and radio-frequency bias to increase the etching process accuracy.

This technique, however, has a problem that the distribution of a deposit gas and an etching gas in the plasmas changes the distribution of deposition and etching within the wafer surface, thus resulting in a difference in the shape within the wafer surface and causing some areas where the footing is improved and others where the footing is not improved.

It is an object of the present invention to provide a plasma processing method capable of achieving flat etching process while suppressing vertical etching.

Means for Solving the Problems

To achieve the above object, as one of the typical plasma processing methods according to the present invention, there is provided a plasma processing method for plasma-etching a titanium nitride (TiN) film that forms a metal gate and contacts an insulating film on both sides, the method including the step of etching the titanium nitride (TiN) film by using plasmas that are generated by using a mixed gas of boron trichloride ($BCl_3$) gas, nitrogen ($N_2$) gas, and nitrogen trifluoride ($NF_3$) gas and are generated by radio-frequency power modulated by a pulse, wherein the pulse has a first period with a first amplitude as its amplitude and a second period with a second amplitude as its amplitude and wherein the second amplitude is greater than 0 and less than the first amplitude.

As another of the typical plasma processing methods according to the present invention, there is provided a plasma processing method for plasma-etching a titanium nitride (TiN) film that forms a metal gate and contacts an insulating film on both sides, the method including the step of etching the titanium nitride (TiN) film by using plasmas that are generated by using a mixed gas of boron trichloride ($BCl_3$) gas, nitrogen ($N_2$) gas, and sulfur hexafluoride ($SF_6$) gas and are generated by radio-frequency power modulated by a pulse, wherein the pulse has a first period with a first amplitude as its amplitude and a second period with a second amplitude as its amplitude and wherein the second amplitude is greater than 0 and less than the first amplitude.

Advantageous Effect of the Invention

The present invention provides a plasma processing method capable of achieving flat etching process while suppressing vertical etching.

Problems, configurations, and advantageous effects other than those described above are clarified in the following description of the embodiments.

BRIEF DESCRIPTION OF THE DRAWINGS

FIGS. 3A and 3B are diagrams illustrating the etched shape of a wafer etched according to a comparative example (FIG. 3A) and the present embodiment (FIG. 3B).

FIG. 4 is a table listing etching conditions used in the present embodiment.

FIG. 7A is a time chart illustrating a repetition frequency of microwave power; FIG. 7B is a diagram schematically illustrating processing performed in a high microwave power section; and FIG. 7C is a diagram schematically illustrating processing performed in a low microwave power section.

FIG. 9 is a diagram illustrating the etching rates of various points of the wafer when the TiN film is treated in the low microwave power section.

MODES FOR CARRYING OUT THE INVENTION

Embodiments of the present invention will be described with reference to the drawings.

First, an example of a plasma etching device (plasma processing device) for implementing a plasma processing method of the present invention is described.

Figure 1:
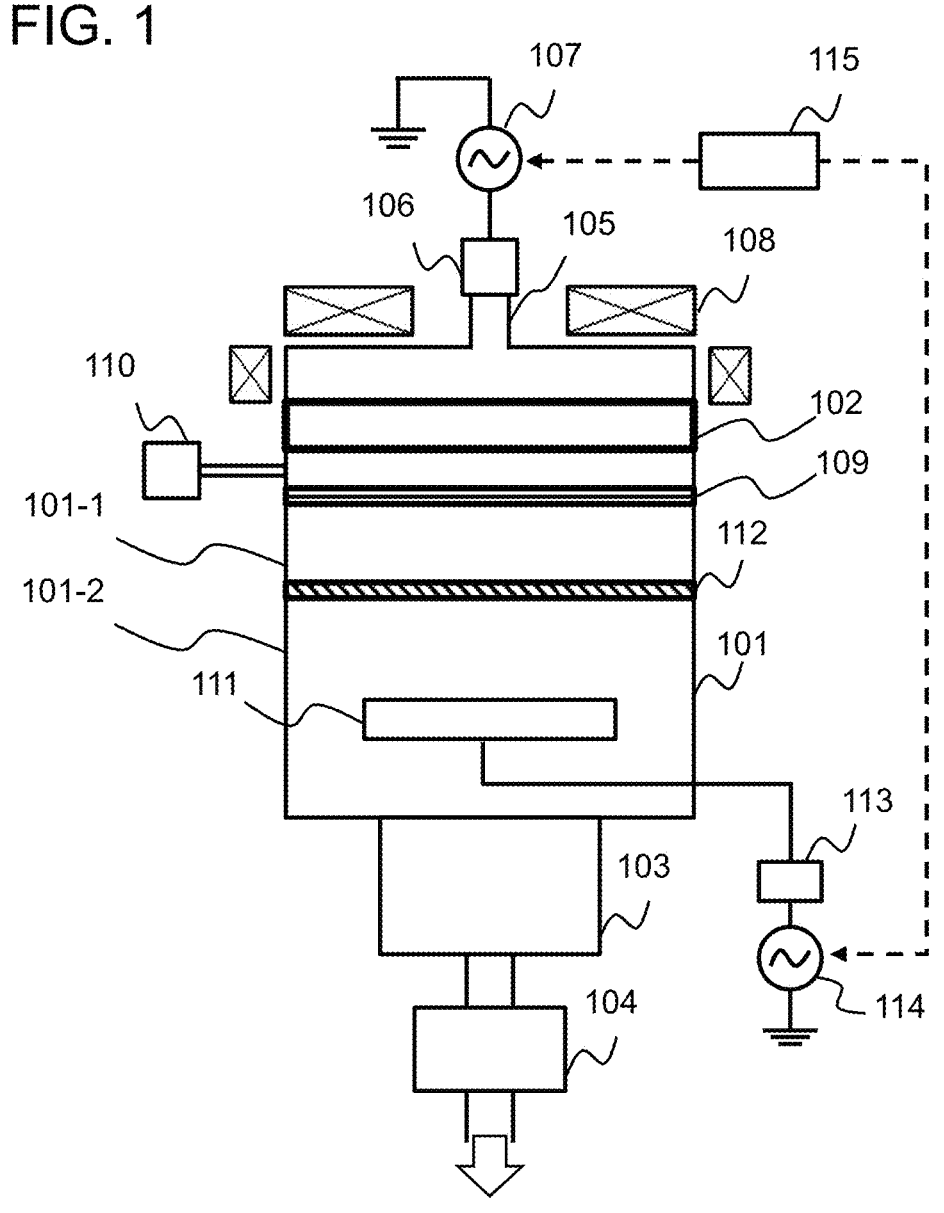
FIG. 1 is a schematic configuration diagram of a plasma processing device according to the present embodiment.

FIG. 1 illustrates the schematic configuration of a plasma etching device. A vacuum vessel 101, whose interior constitutes a processing chamber, is a cylindrical vessel made of conductive material such as, for example, aluminum, and is electrically grounded. The upper opening of the vacuum vessel 101 is sealed by a top panel 102 made of a material that is permeable to electromagnetic waves such as, for example, quartz. At the bottom center of the vacuum vessel 101, there are placed a turbo molecular pump 103 that depressurizes and exhausts the inside of the processing chamber to a predetermined pressure and a dry pump 104 connected to the turbo molecular pump 103. A waveguide 105 located above the top panel 102 is connected to a radio-frequency power supply for plasma generation (hereinafter, referred to as "plasma power supply 107") via a matcher 106. The plasma power supply 107 is connected to a control device 115.

The plasma power supply 107 emits microwaves at 2.45 GHz. The emitted microwaves pass through the matcher 106 and propagate through the waveguide 105, and then are introduced into the vacuum vessel 101 through the top panel 102. Outside the vacuum vessel 101, a solenoid coil 108 is placed to form a magnetic field inside the vacuum vessel 101. A shower plate 109 is provided in the upper part of the vacuum vessel 101 below the top panel 102, and a pipe leading to a gas supply device 110 is connected between the top panel 102 and the shower plate 109 of the vacuum vessel 101.

The gas supply device 110 supplies a process gas to a space between the top panel 102 and the shower plate 109, and supplies the process gas into the processing chamber, which is formed inside the vacuum vessel 101, through the shower plate 109. Inside the vacuum vessel 101, a sample table 111 is provided, and a wafer is brought in from a wafer loading port, which is not illustrated, and then placed and held on the sample table 111. A radio-frequency power supply for bias 114 is connected to the sample table 111 via a bias matcher 113. The radio-frequency power supply for bias 114 is connected to the control device 115.

In the plasma etching device configured as described above, the process gas supplied into the vacuum vessel 101 is plasmatized by the action (for example, electron cyclotron resonance (ECR)) of the microwave electric field introduced through the top panel 102 and the magnetic field formed by the solenoid coil 108, and plasmas are formed in a space between the shower plate 109 and the sample table 111. The plasmas are formed near a plane with a magnetic field strength of 875 gauss, which is called the ECR surface.

In the plasma etching device of this embodiment, an ion shielding plate 112 made of a material permeable to electromagnetic waves such as, for example, quartz, divides the interior of the vacuum vessel 101 into a vacuum vessel upper region 101-1 and a vacuum vessel lower region 101-2. Therefore, if plasmas are able to be generated in the vacuum vessel upper region 101-1, which is the upper part of the ion shielding plate 112, ions are shielded by the ion shielding plate 112, thereby enabling a sample to be treated only with radicals. In this embodiment, titanium nitride (TiN) film is able to be etched while shielding ions generated by the plasmas.

The position where the plasmas are formed is able to be controlled by the solenoid coil 108. Since the ion shielding plate 112 is made of a material permeable to electromagnetic waves, dry etching by ordinary plasmas is also possible by controlling the solenoid coil 108 so that the ECR surface is formed in the vacuum vessel lower region 101-2.

When dry etching is performed by forming plasmas in the vacuum vessel lower region 101-2, radio-frequency power is applied to the sample table 111 from the radio-frequency power supply for bias 114 via the bias matcher 113. The radio-frequency power applied to the sample table 111 is controlled independently of the generation of the plasmas, and generates a bias voltage that injects the ions in the plasmas onto the wafer.

The plasma power supply 107 and the radio-frequency power supply for bias 114 are output-controlled by the control device 115.

Subsequently, the structure of the wafer, which is an object to be treated in this embodiment, and a plasma etching method are described.

The plasma etching method of this embodiment includes a first step of supplying at least boron trichloride ($BCl_3$), nitrogen ($N_2$), and nitrogen trifluoride ($NF_3$) as a mixed gas to the processing chamber, and a second step of supplying microwave power from the radio-frequency power supply to the processing chamber. In addition, sulfur hexafluoride ($SF_6$) is also able to be supplied, instead of the nitrogen trifluoride ($NF_3$).

Figure 2:
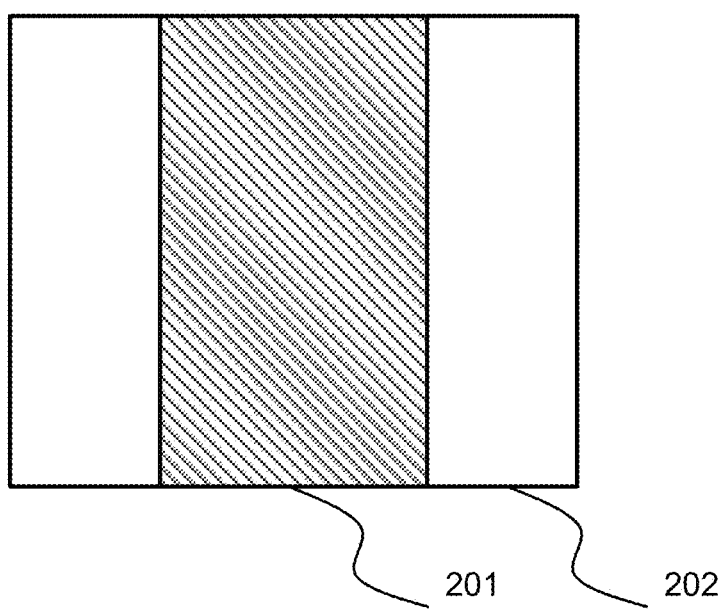
FIG. 2 is an enlarged cross-sectional view of the film structure of a wafer used in the present embodiment.

FIG. 2 is an enlarged cross-sectional view of the film structure of the wafer used in this embodiment. An interlayer insulating film such as, for example, an oxide film 202 is formed around a TiN film 201, which is a metal film. In order to etch the TiN film, which constitutes a metal gate and is in contact with the insulating film on both sides, so as to be flat from the upper side of FIG. 2, it is necessary to selectively etch the TiN film against the oxide film.

Figures 3A, 3B:
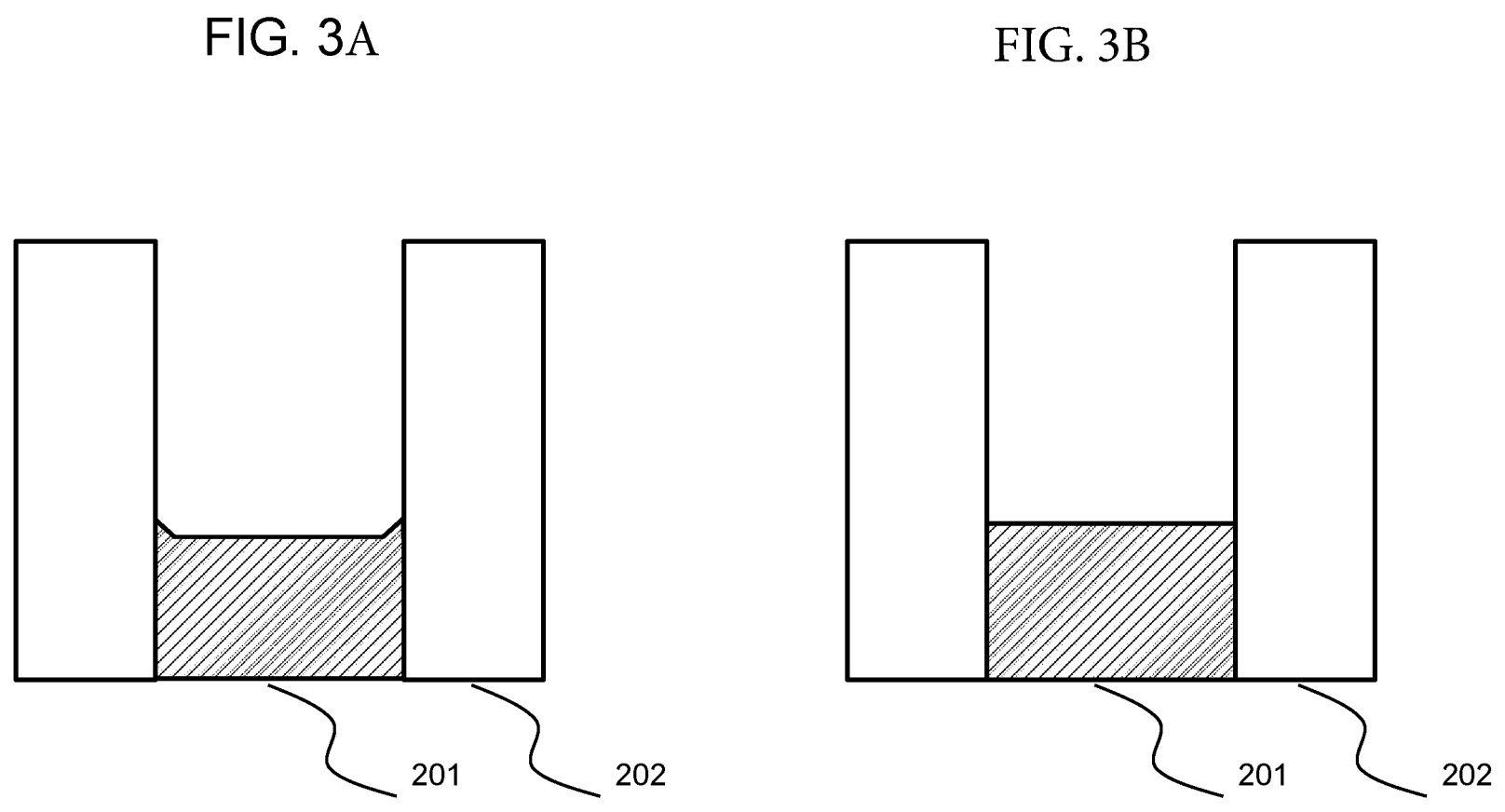

FIGS. 3A and 3B are cross-sectional views illustrating the film structures of a wafer etched by the etching methods of the comparative example and this embodiment. First, in the comparative example, etching is performed in the sidewall direction by ions in the plasmas, by which etching progresses slightly in the center depth direction (FIG. 3A), and it is difficult to process the etched surface flat.

In contrast, in this embodiment, the plasma power supply 107 is controlled in the step of etching the titanium nitride (TiN) film by plasmas generated by pulse-modulated radio-frequency power to generate radicals without ions, to control the deposition and etching, and to set the microwave power so that the interval of the high section is equal to that of the low section. This enables a flat shape to be achieved as illustrated in FIG. 3B.

The following describes suitable processing conditions for the etching method of this embodiment with reference to the table in FIG. 4. Argon (Ar), boron trichloride ($BCl_3$), nitrogen ($N_2$), and nitrogen trifluoride ($NF_3$) are supplied into the processing chamber at 75 ml/min, 40 ml/min, 50 ml/min, and 13 ml/min, respectively. Microwave power is supplied from the plasma power supply 107 with pulse modulation in a square-wave form at 1100 W that is first power (high micropower 1) and at 300 W that is second power (low micropower 2), which is greater than 0 W. The repetition frequency of the pulse modulation is set to 100 Hz and the duty ratio to 50%. Note that the pulse has a first period with a first amplitude (1100 W) as its amplitude and a second period with a second amplitude (300 W) as its amplitude, where the second amplitude is greater than 0 and less than the first amplitude.

Figure 5:
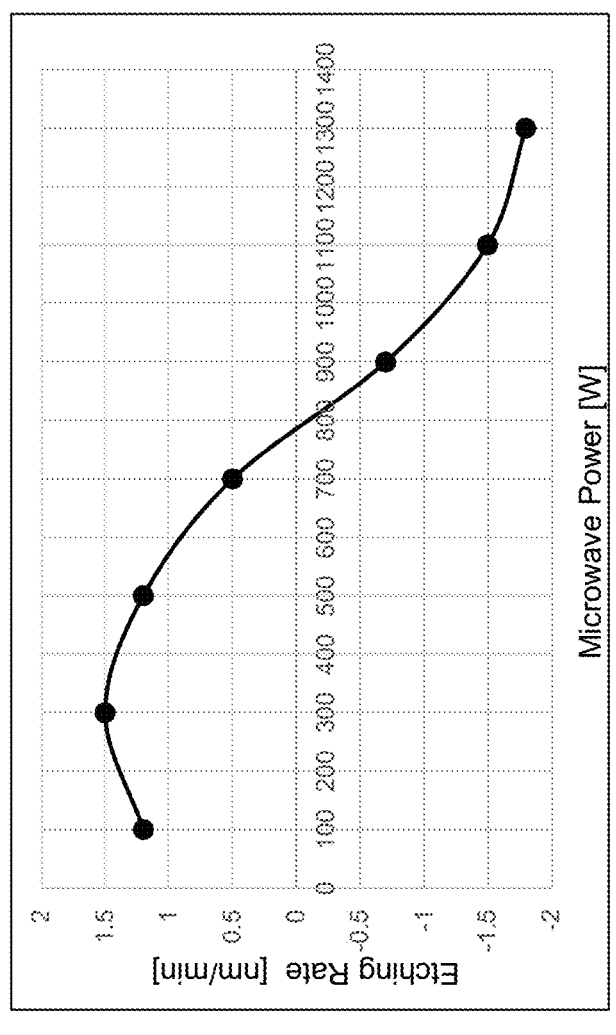
FIG. 5 is a diagram illustrating the microwave power dependence of a deposition/etching rate of a TiN film.

FIG. 5 is a diagram illustrating an example of the microwave power dependence of an etching rate of the TiN film, with the etching rate on the vertical axis and microwave power provided by the plasma power supply 107 on the horizontal axis. In this specification, it is assumed that deposition progresses when the etching rate is negative and that etching progresses when the etching rate is positive. This specification provides an example that a mixed gas of boron trichloride ($BCl_3$), nitrogen ($N_2$), and nitrogen trifluoride ($NF_3$) is used.

In the example illustrated in FIG. 5, when the microwave power given by the plasma power supply 107 is varied, a power region where deposition is made on the TiN film and a power region where etching is performed on the TiN film switch to each other at a boundary value of about 800 W.

In the power region where deposition is performed (the first period), the dissociation of boron trichloride ($BCl_3$) is accelerated and the reaction with nitrogen ($N_2$) proceeds, resulting in the formation of a BN-based deposited film. On the other hand, in the power region where etching is performed (the second period), the dissociation of boron trichloride ($BCl_3$) is suppressed and the formation of the BN-based deposited film decreases, and therefore etching by nitrogen trifluoride ($NF_3$) proceeds. In other words, controlling the dissociation of boron trichloride ($BCl_3$) by changing the microwave power enables the deposition and the etching to be switched to each other arbitrarily.

The present inventor's research has also indicated that the repetition frequency of the pulse-modulated microwave power from the plasma power supply 107 enables appropriate deposition and etching.

For example, increasing the flow rate of boron trichloride ($BCl_3$) to 50 ml/min changes the microwave power dependence of the etching rate of the TiN film. Specifically, it is also found that the microwave power at which the switching between deposition and etching occurs changes at a boundary value of 600 W when the flow rate of $BCl_3$ is increased by 50 ml/min. In other words, controlling the microwave power and the flow rate of boron trichloride ($BCl_3$) enables switching between deposition and etching. Therefore, it is desirable that the boundary value of microwave power for switching between deposition and etching is, for example, in a range between 500 W and 900 W.

FIGS. 6A to 7C are diagrams illustrating the repetition frequency of microwave power and the relationship between deposition and etching. According to this embodiment, a flat surface with suppressed footing is able to be formed by repeated deposition and etching with radicals on a metal film with footing, for example.

Figures 6A, 6B, 6C:
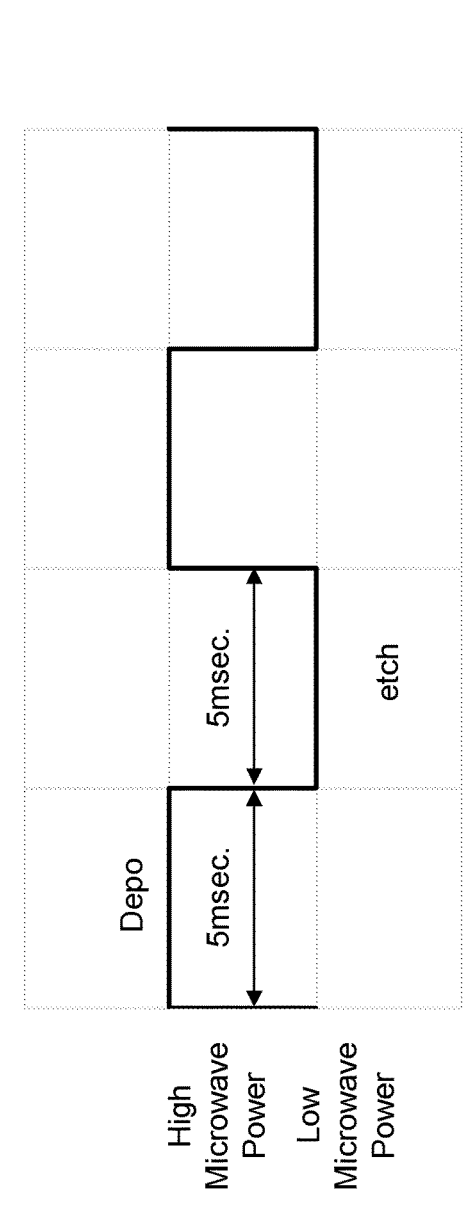
FIG. 6A is a time chart illustrating a repetition frequency of microwave power.
FIG. 6B is a diagram schematically illustrating processing performed in a high microwave power section.
FIG. 6C is a diagram schematically illustrating processing performed in a low microwave power section.

The time chart in FIG. 6A illustrates an example in which the pulse modulation of microwave power has been performed with a repetition frequency of 100 Hz and a duty ratio of 50%. In the example illustrated in FIG. 6A, the intervals of high and low microwave power are 5 msec each. Therefore, in the high microwave power section, deposition is sufficiently performed especially in the central region by the BN-based deposition radicals 203, as schematically illustrated in FIG. 6B. In the low microwave power section, as schematically illustrated in FIG. 6C, etching radicals suppress vertical etching, and only the footing portion, which is formed in the corner near the wall of the oxide film 202, is able to be etched without changing the etching depth. This enables only the footing portion to be etched without changing the etching depth, thereby enabling the TiN film 201 to be etched into a flat shape.

On the other hand, the time chart in FIG. 7A illustrates an example in which the pulse modulation of microwave power has been performed with a repetition frequency of 1000 Hz and a duty ratio of 50%. In the example illustrated in FIG. 7A, the intervals between high microwave power and low microwave power are very short (0.5 msec). Therefore, as schematically illustrated in FIG. 7B, in the high microwave power section, the BN-based deposition radicals 203 and etching radicals 204 coexist and deposition is suppressed, by which switching to the low microwave power occurs before sufficient deposition is achieved. Therefore, in the low microwave power section, the etching radicals 204 may cause etching to progress in the depth direction and may prevent the footing from being removed, as schematically illustrated in FIG. 7C.

Therefore, it is preferable to set the pulse repetition frequency equal or below 500 Hz to ensure sufficient deposition, and even more preferable to set the pulse repetition frequency equal or below 100 Hz.

Figure 8:
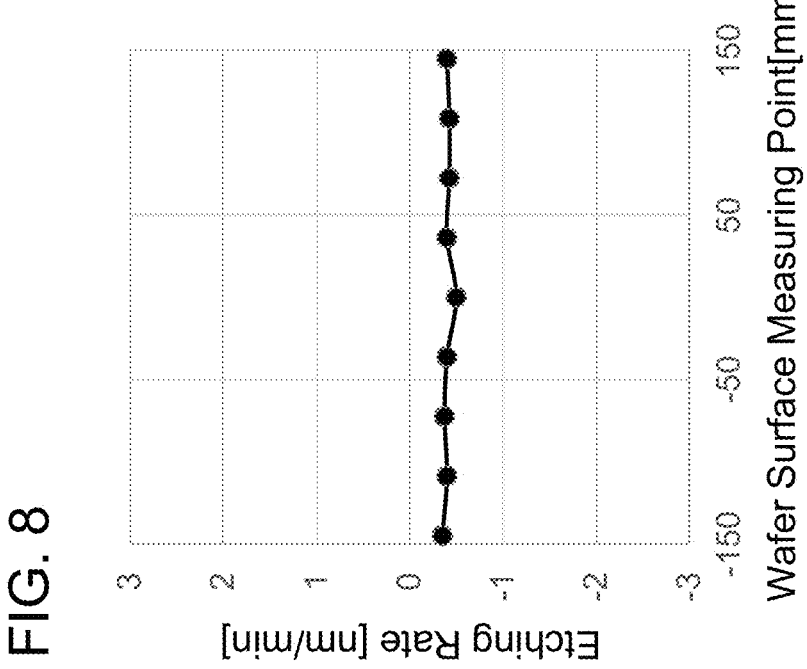
FIG. 8 is a diagram illustrating the etching rates of various points of the wafer when the TiN film is treated in the high microwave power section.

FIG. 8 is a diagram illustrating the etching rates of various points of the wafer when the TiN film is treated in the high microwave power section, with the etching rate at the center of the wafer set to 0. The processing was performed here at 1100 W of microwave power, at which deposition occurs, for the gas types illustrated in FIG. 4. According to the etching rates illustrated in FIG. 8, the negative values are approximately the same in all of the various points within the wafer surface, indicating good uniformity of the deposition.

Generally, when deposition is performed by plasmas, the deposition gases in the plasmas are usually concentrated in the center of the plasmas. Therefore, also in the deposition distribution within the wafer surface, deposition is concentrated in the center of the wafer, and the deposition at the outer edge of the wafer becomes small. The reason therefor is that the particles constituting the plasmas are ions and electrons, and the movement of the ions and electrons is restricted by electrostatic effects. Therefore, the plasma distribution is generally controlled by various parameters such as the pressure of the processing chamber and the microwave power.

In this embodiment, however, radicals are used for processing in the absence of most ions, and radicals, which are electrically neutral, are not subject to electrostatic effects, and therefore have good mobility in space relative to the plasmas. Therefore, radicals are uniformly distributed in the processing chamber, thereby increasing the uniformity of deposition within the wafer surface.

Figure 9:
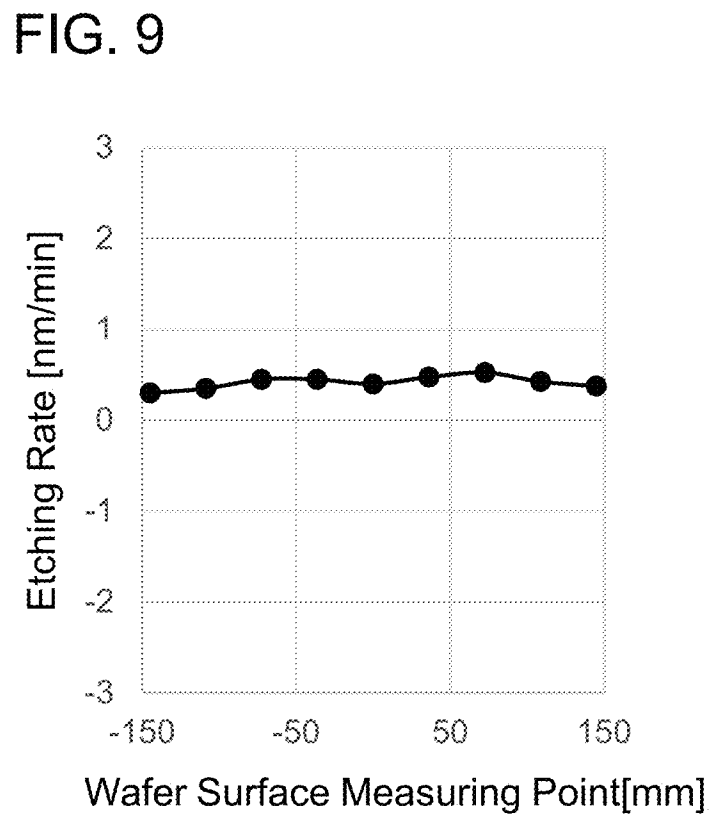

FIG. 9 is a diagram illustrating the etching rates of various points of the wafer when the TiN film is treated in the low microwave power section, with the etching rate at the center of the wafer set to 0 similarly. The processing was performed here at 300 W of the microwave power, at which etching occurs, for the gas types illustrated in FIG. 4. According to the etching rates illustrated in FIG. 9, the positive values are approximately the same in all of the various points within the wafer surface, similarly to the result in FIG. 8, indicating good uniformity of the etching within the wafer surface. This is also due to the processing performed with electrically neutral radicals.

Therefore, performing processing with radicals under the control of the plasma power supply 107 enables deposition and etching to be performed at approximately the same rate within the wafer surface. The term "approximately the same rate" means that a difference in the absolute value between the deposition rate and the etching rate is less than or equal to $\frac{1}{10}$ of the etching rate.

Even if the microwave power setting does not cause the absolute values of the negative and positive values of the etching rates to be approximately the same, the absolute values of the negative and positive values of the etching rates are able to be approximately the same by controlling the duty ratio, as long as the frequency is at which the deposition is sufficiently performed.

The present invention is not limited to the above embodiments, but includes various modifications other than the above. For example, the embodiments described above are described in detail for the purpose of describing the present invention in an easy-to-understand manner, and are not necessarily limited to those having all the described configurations.

DESCRIPTION OF REFERENCE NUMERALS

101 vacuum vessel
102 top panel
103 turbo molecular pump
104 dry pump
105 waveguide
106 matcher
107 plasma power supply
108 solenoid coil
109 shower plate
110 gas supply device
111 sample table
112 ion shielding plate
113 bias matcher
114 radio-frequency power supply for bias
115 control device
201 TiN film
202 oxide film
203 BN-based deposition radical
204 etching radical

The invention claimed is:

1. A plasma processing method for plasma-etching a titanium nitride (TiN) film that forms a metal gate and contacts an insulating film on both sides, the method comprising:

a step of etching the titanium nitride (TiN) film having a first footing portion and a second footing portion disposed at respective bottom corners of opposite walls of the insulating film which contacts the titanium nitride (TiN) film on both sides, by using plasmas that are generated by using a mixed gas of boron trichloride (BCl$_3$) gas, nitrogen (N$_2$) gas, and nitrogen trifluoride (NF$_3$) gas and are generated by radio-frequency power modulated by a pulse, wherein the pulse has a first period with a first amplitude as its amplitude and a second period with a second amplitude as its amplitude, wherein the second amplitude is greater than 0 and less than the first amplitude, wherein a deposited film is formed on a central region only of the titanium nitride (TiN) film between the first and second footing portions during the first period, wherein only the first and second footing portions of the titanium nitride (TiN) film are etched during the second period, wherein the pulse causes the etched titanium nitride (TiN) film to have a flat shape, and wherein the method further comprises controlling a flow rate of the boron trichloride (BCl$_3$) gas and the radio-frequency power to enable switching between deposition of the deposited film and etching of the titanium nitride (TiN) film to occur at a boundary value of between 500 W and 900 W.

2. The plasma processing method according to claim 1, wherein the titanium nitride (TiN) film is etched while shielding the titanium nitride (TiN) film from ions generated by the plasmas.

3. The plasma processing method according to claim 1, wherein a repetition frequency of the pulse is less than or equal to 500 Hz.

4. A plasma processing method for plasma-etching a titanium nitride (TiN) film that forms a metal gate and contacts an insulating film on both sides, the method comprising:

a step of etching the titanium nitride (TiN) film having a first footing portion and a second footing portion disposed at respective bottom corners of opposite walls of the insulating film which contacts the titanium nitride (TiN) film on both sides, by using plasmas that are generated by using a mixed gas of boron trichloride (BCl$_3$) gas, nitrogen (N$_2$) gas, and sulfur hexafluoride (SF$_6$) gas and are generated by radio-frequency power modulated by a pulse, wherein the pulse has a first period with a first amplitude as its amplitude and a second period with a second amplitude as its amplitude, wherein the second amplitude is greater than 0 and less than the first amplitude, wherein a deposited film is formed on a central region only of the titanium nitride (TiN) film between the first and second footing portions during the first period, wherein only the first and second footing portions of the titanium nitride (TiN) film are etched during the second period, and wherein the pulse causes the etched titanium nitride (TiN) film to have a flat shape, and wherein the method further comprises controlling a flow rate of the boron trichloride ($BCl_3$) gas and the radio-frequency power to enable switching between deposition of the deposited film and etching of the titanium nitride (TiN) film to occur at a boundary value of between 500 W and 900 W.

\* \* \* \* \*